United States Patent [19]

Richer

[11] 4,092,185
[45] May 30, 1978

[54] METHOD OF MANUFACTURING SILICON INTEGRATED CIRCUITS UTILIZING SELECTIVELY DOPED OXIDES

[75] Inventor: John Wilfred Richer, Wilmslow, England

[73] Assignee: International Computers Limited, London, England

[21] Appl. No.: 706,459

[22] Filed: July 19, 1976

[30] Foreign Application Priority Data

Jul. 26, 1975 United Kingdom ............... 31358/75

[51] Int. Cl.$^2$ ..................... H01L 21/76; H01L 21/20; H01L 21/225
[52] U.S. Cl. .................................... 148/175; 29/578; 148/187; 148/188; 357/48; 357/54; 357/89; 357/90
[58] Field of Search ....................... 148/175, 187, 188; 357/48, 89, 90; 29/578; 427/85, 93, 331

[56] References Cited

U.S. PATENT DOCUMENTS

| 2,804,405 | 8/1957 | Derick et al. ................... 148/188 X |
| 3,260,902 | 7/1966 | Porter ............................. 357/48 X |
| 3,287,187 | 11/1966 | Rosenheinrich .................. 148/187 |
| 3,293,087 | 12/1966 | Porter ............................. 148/175 |
| 3,327,182 | 6/1967 | Kisinko ........................... 357/48 X |
| 3,481,801 | 12/1969 | Hugle ............................. 148/175 |
| 3,529,217 | 9/1970 | Van Santen ..................... 357/48 X |
| 3,649,387 | 3/1972 | Frentz et al. ................... 148/188 X |
| 3,730,787 | 5/1973 | Murphy et al. ................... 148/175 |
| 3,867,204 | 2/1975 | Rutledge ........................ 148/188 |

OTHER PUBLICATIONS

Czorny, B., "Epitaxy-Versatile — Integrated Circuits" R.C.A. Engineer, vol. 13, No. 3, 10–11, 1967, pp. 28–32.

Ashar et al., "Semiconductor Device Structure and Method of Making" I.B.M. Tech. Discl. Bull., vol. 11, No. 11, Apr. 1969, pp. 1529–1530.

*Primary Examiner*—L. Dewayne Rutledge
*Assistant Examiner*—W. G. Saba
*Attorney, Agent, or Firm*—Misegades, Douglas & Levy

[57] ABSTRACT

A method of forming buried regions in a printed circuit substrate in which; a first layer of doped silicon oxide is deposited on the substrate, a pattern of apertures is produced in this layer and a second layer of differently doped silicon oxide is deposited to fill in apertures. The first layer silicon dioxide acts as a mask to the doping material so that when the two layers are subjected to a common diffusion step both doping materials are driven into the substrate, with the second layer doping material restricted to the regions of the apertures.

3 Claims, 8 Drawing Figures

REMOVAL OF OXIDE LAYERS

EPITAXIAL LAYERING

SECOND DIFFUSION

PROVISION OF SUBSTRATE

FORMATION OF N+ OXIDE LAYER

GAP FORMATION

FORMATION OF P+ OXIDE LAYER

DIFFUSION OF N+ AND P+ MATERIALS

REMOVAL OF OXIDE LAYERS

EPITAXIAL LAYERING

SECOND DIFFUSION

METHOD OF MANUFACTURING SILICON INTEGRATED CIRCUITS UTILIZING SELECTIVELY DOPED OXIDES

BACKGROUND OF THE INVENTION

1. Field of the Invention

This invention relates to the manufacture of integrated circuit structures.

In the design and fabrication of high yield low cost silicon integrated devices it is frequently desirable to be able to obtain precisely shaped and sized zones for example buried zones and/or isolation zones of required conductivity type within single crystal substrate structures. That is to say, it is desirable to have p type or n type material located within a region of the substrate of the opposite conductivity, or it is desirable to have various combinations of $n, p: n- p-; n+; p+$ conductivities in a substrate.

The zones of various conductivity properties are used to fabricate various electrical components and are usually produced by a combination of diffusion and epitaxial techniques. The diffusion techniques make it possible to deposit on to a substrate silicon oxide layers with selected amounts of impurity materials so as to achieve a selected conductivity property, i.e., $n-, p-; n, p; p+$ or $n+$. Furthermore, the choice of material also enables control over the rate at which materials can diffuse into the substrate.

A known method of forming such an isolated zone involves applying to the surface of a silicon substrate having a first conductivity, for example, $p$ conductivity a layer of $SiO_2$. A pattern is formed in the $SiO_2$ layer, the pattern defining the position and size of the required isolated zone, by any conventional method used in the art, for example a method employing a photo-resist.

A layer of a silicon oxide doped with, for example, arsenic which will provide an $n+$ conductivity is applied onto the previously applied layer and into the gaps defined by the pattern. The thus produced substrate and the silicon oxide layers are subjected to a heat treatment which causes the arsenic to diffuse into the silicon substrate. The arsenic is able to enter the substrate at only those place(s) defined by the pattern since the silicon oxide layer initially applied to the substrate blocks the passage of the arsenic.

After the diffusion stage the oxide layers are removed and, if necessary, the surface of the substrate is cleaned by a suitable treatment. If it is desired to form a buried layer, this is followed by the application of an epitaxial layer which essentially forms with the substrate a continuation of the single crystal of the substrate which effectively buries the zone containing the diffused arsenic. This epitaxial layer conveniently has an $n$ conductivity.

The use of a buried layer is convenient whenever a transistor is required in the completed integrated circuit. The buried layer of arsenic forms a low resistivity layer which is usually located beneath the collector junction of the transistor which is subsequently formed on the epitaxial layer by further depositioning of oxide layers, the diffusion stages. To isolate the area of the N epitaxial layer grown above the buried N+ diffusion from the remainder of the crystal by conventional techniques, a layer of silicon dioxide is grown on the top surface and a channel is cut in it to surround the buried diffused area. An oxide doped with boron is deposited on the top surface and heated so as to diffuse the boron into the epitaxial layer to link up with the P doped starting material. The N and the buried N+ diffusion are now totally surrounded by P doped silicon and, hence, are isolated provided the P silicon is held at the most negative voltage applied to the integrated circuit.

The remaining layers can be applied as follows. A silicon dioxide layer is applied to the surface of the epitaxial layer.

A further pattern is provided in this silicon oxide layer by a photo resist method and a further silicon. oxide layer containing an additive, e.g., boron, is applied to this second layer. The device as so far produced is subjected to a diffusion stage to drive-in the p type material to form the base of the transistor.

The required emitter pattern is formed by photo-engraving techniques and silicon oxide containing an $n+$ additive is applied to the device, the $n+$ material being, for example, arsenic or phosphorous. The $n+$ material is driven into the substrate material by a further diffusion process.

In the known processes such as are exemplified by the above it is necessary to undertake a diffusion stage for each layer as it is applied. In practice, as is well known, this will involve a number of process steps.

It is an object of the invention to reduce the number of process steps involved in order to produce a buried and/or isolated layer.

SUMMARIES OF THE INVENTION

According to a first aspect of the invention there is provided a method of driving in first and second additive materials with different conductivity characteristics into the surface of a semi-conductive substrate, including the steps of providing on the substrate surface a first layer of a semi-conductive material including the first additive material; forming a pattern of openings in the first layer; providing, using the patterned first layer as a mask, a second layer of a semi-conductive material including the second additive material which is such that the first layer material provides a diffusion barrier thereto; simultaneously causing the material of both layers to diffuse into the substrate; said diffusion being continued until a desired depth of penetration of the additive materials into the substrate is obtained.

According to a second aspect of the invention there is provided a method of forming a buried and isolated layer in an integrated circuit including the steps of; applying to a substrate of semi-conductive material a first layer of semi-conductive material containing a first additive material having first conductivity characteristics and a first rate of diffusion with respect to the material of the substrate; forming a pattern of openings in the first layer; applying, using the first layer as a mask, a second layer of a semi-conductive material containing a second additive having a second conductivity and a second rate of diffusion with respect to the material of the substrate which is different from that of the first layer, such second additive material being such that the first layer material provides a diffusion barrier to the second layer material simultaneously causing the materials of both layers to diffuse into the substrate material arresting the diffusion operation after a predetermined extent of diffusion of said additive materials into the substrate has occurred, removing the first and second layers to expose the substrate and epitaxially growing the substrate to bury the diffused regions produced by said diffusion operation.

Conveniently, the first layer is placed over the whole working surface area of the substrate and a pattern of gaps is formed in the layer, and wherein, the second layer is applied so as at least to co-operate with the gaps.

BRIEF DESCRIPTION OF THE DRAWINGS

For a better understanding of the invention the various stages involved in producing an integrated circuit structure utilizing the process of the invention will be described with reference to the accompanying flow sheet in which the successive FIGS. 1 to 8 each represent stages of the process of the invention.

DESCRIPTION OF PREFERRED EMBODIMENT

Figure 1:
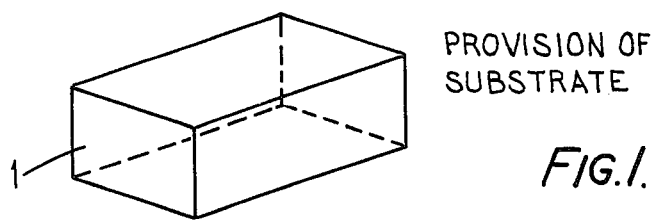

The FIG. 1 stage involves the preparation of a substrate 1 having the required physical dimensions and semi-conductive properties. In particular this stage involves providing a slice of doped silicon which exhibits p type semi-conductive characteristics, and is in fact a p-type single crystal. It will be understood that the selection of the material for the substrate and its conductivity state will depend upon the intended functions of the completed integrated circuit.

Figure 2:
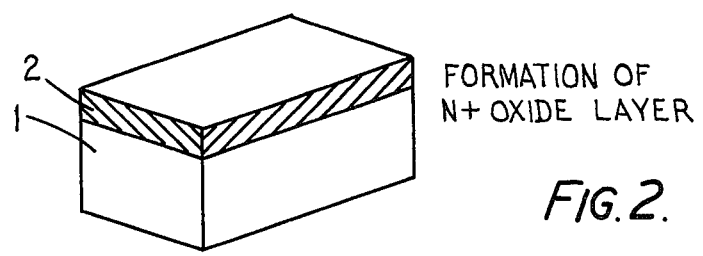

In the stage of FIG. 2 a layer 2 of silicon dioxide which is heavily doped to form a $n+$ semi-conductive material is deposited upon the substrate. The mode of depositioning can be any of the processes conventional in the art for example, vapor depositioning. This doped oxide layer has a thickness of ½ to 1 micron. The layer conveniently comprises silicon dioxide doped with arsenic.

Figure 3:
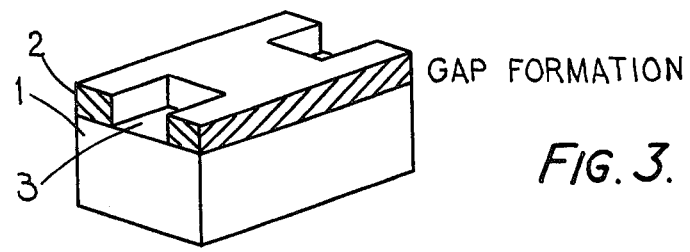

In the stage of FIG. 3 certain areas of the layer 2 are removed to provide openings or gaps 3 at desired locations in the layer 2, which are deep enough to expose the surface of the substrate. These gaps 3, are conveniently formed by any suitable process which is well known in the art. For example, a photo-resist process can be used. In the present case the doped oxide layer 2 is removed by a photo resist process from the areas at which an $n+$ material is not required, so that material of the doped oxide layer 2 remains at those locations at which $n+$ characteristics are desired. In the flow diagram the locations 3 from which layer 2 material is removed has been indicated by two spaced rectangles.

Figure 4:
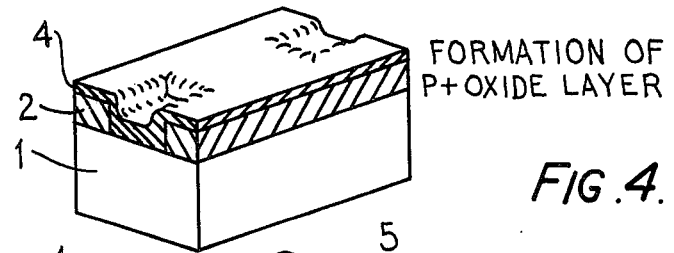

In the stage of FIG. 4 a layer 4 of silicon dioxide which is heavily doped to form a $p+$ semiconductive material is deposited immediately upon the remainder of the layer 2 and on the freshly exposed parts of the substrate arising from the formation of the gaps 3. The mode of depositing is effected by any of the conventional depositing arrangements used in the art (i.e., vapor depositioning). This doped oxide layer has a thickness of ½ to 1 micron and comprises silicon oxide doped with Boron. At this point it will be understood that the substrate has been coated with two layers of doped material and that no actual attempt has been made to drive in any of the doping materials into the substrate. In other words the process as so far considered has not involved the various process stages involved in preparing for diffusion; effecting diffusion; and or diffusion processes in relation to the individual layers 2 and 4.

Figure 5:
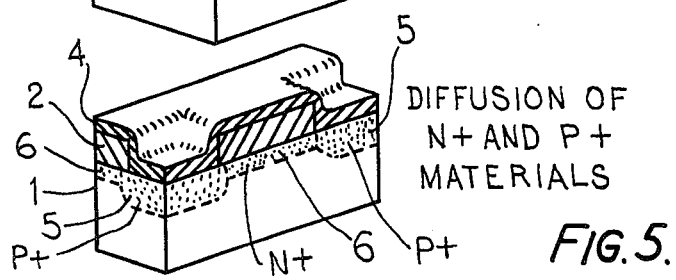

In the stage of FIG. 5 both layers are subjected to a common diffusion step or operation. This diffusing operation involves subjecting the unit, that is the substrate plus the two superimposed layers, to a lengthy heat soak, for example, a heat soak lasting 5 hours at 1250° C. This ensures that the additive, i.e., doping materials are able simultaneously to diffuse into the substrate to the required extents. The arsenic has a slower rate of diffusion into silicon as compared with that of the boron. Consequently, for the same heat treatment the boron diffuses into the silicon substrate to a greater depth than that of the arsenic. Furthermore, since the silicon dioxide acts as a barrier or mask to the diffusing action of the boron, the diffusion of the boron is effectively restricted to those areas 3 that are free of the silicon dioxide layer 2. Consequently, the net effect of this diffusion stage is to obtain a relatively deep diffusion of the boron into the substrate in the vicinity of the gaps 3 and relatively shallow diffusion of the arsenic into areas elsewhere. This particular condition is shown in the flow sheet in which the FIG. 5 representation is a section through the gaps 3 showing the relative diffusion extents for the arsenic and boron. In the drawing the diffusion zones arising from the layer 4 material are indicated at 5 and the diffusion zones arising from the layer 2 are indicated at 6. The regions 6 are 10 to 15 microns deep and have a sheet resistivity of 1 – 10 ohms and the regions 5 have a thickness of 3 to 4 microns. From the above it will be apparent that the initial diffusion of two dissimilar dopant materials has been achieved by means of a single diffusion stage in which the material of the layer 2 acts as a mask with respect to the material of the layer 4.

Figure 6:
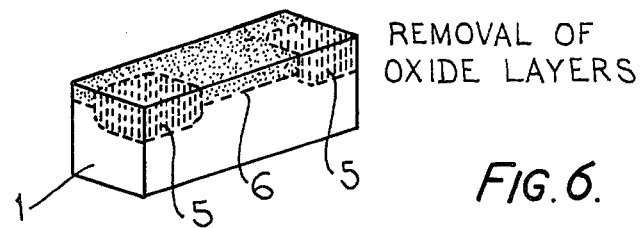

In the stage of FIG. 6 the oxide layers 2 and 4 are then removed by a chemical etching operation. This can be achieved by using Hydroflouric acid. This leaves the substrate 1 containing the diffused material zones 5 and 6.

Figure 7:
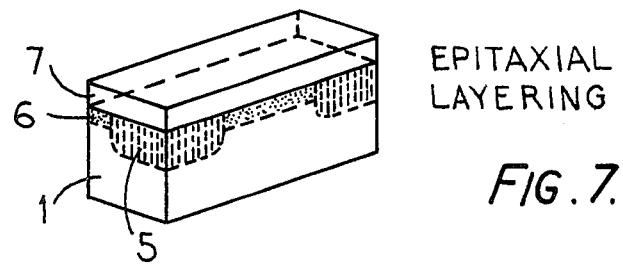

In the stage of FIG. 7 which follows the removal of the oxide layers a thin layer of the diffused surface of the substrate is removed, this layer having a thickness of ¼ to ½ micron. The layer removal can be effected by using HCl in a carrier gas. This step leaves a clean surface to the substrate upon which a thin layer of n-type silicon is expitaxially formed by heating the substrate at 1175° in the presence of $SiCl_4$ which is conveniently transported in a carrier gas within a conventional epitaxial layer forming installation.

Figure 8:
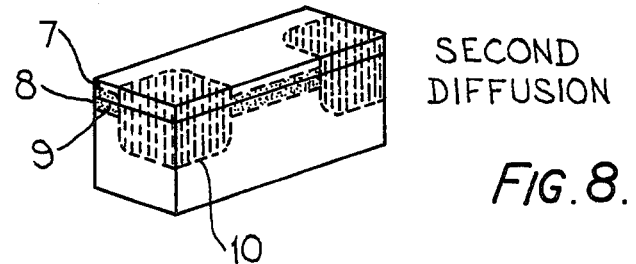

In the stage represented by FIG. 8 the unit as so far produced is subjected to a further diffusing step — This is conveniently carried out in the epitaxial layering installation by maintaining the temperature until the buried boron $p+$ diffuses to the front face of the epitaxial layer to change the n-type epitaxial layer 7 to $p$ type. After this stage the unit will include a $p$ type substrate; a buried $n-$ region; two spaced $p+$ regions and an $n-$ region which lies between the $p+$ regions and the $n+$ region. In other words the $n-$ region is isolated from the substrate by the regions $p+$ and $n+$.

As compared with the known processes the process of the invention eliminates the need to undertake a separate masking operation so as to form the $p+$ pattern since this is effectively achieved when producing the $n+$ region.

Furthermore, since the $p+$ pattern is applied before the epitaxial layer formation a separate doping and drive-in process for the $p+$ material is avoided since the treatment in the epitaxial layering cell will also effect a degree of diffusion.

A further consequence of effecting the simultaneous application of the $n+$ and $p+$ diffusion is that the physical space needed for accommodating the tolerances necessary for mask-making and alignment purposes is reduced.

I claim:

1. A method of forming a buried and isolated layer in an integrated circuit including the steps of,
   (a) forming a substrate of semiconductive material having a first conductivity characteristic,
   (b) applying to the substrate a first layer of a semiconductive oxide layer containing a first additive having second conductivity characteristics different from that of the substrate and a first rate of diffusion with respect to the material of the substrate,
   (c) forming a pattern of openings in the first layer;
   (d) applying a second layer of a semiconductive oxide containing a second additive having a conductivity characteristic of the same polarity as that of the substrate and also a rate of diffusion with respect to the material of the substrate which is faster than the rate of diffusion of the first additive material, said second additive material also being such that the oxide of the first layer acts as a diffusion barrier thereto;
   (e) simultaneously causing the first and second additives to diffuse into the substrate;
   (f) arresting the diffusion operation when the slower diffusing additive materials have penetrated to the required extent in the substrate;
   (g) removing said layers from the substrate;
   (h) operating upon the now exposed surface of the substrate to render it suitable for epitaxial growth;
   (i) epitaxially growing an extension layer to the substrate, said extension layer having a conductivity as desired, so as to bury the regions containing the diffused in additives, and;
   (j) subjecting the substrate to a second diffusion operation for a period long enough for the faster diffusing additive to reach the other outer surface of the epitaxial layer.

2. A method as claimed in claim 1, in which the first additive has a negative conductivity, the second additive a positive conductivity, the substrate a positive conductivity and the epitaxial layer a negative conductivity, and in which the extent of the first diffusion and the thickness of the epitaxial layer is such that during the second diffusion step the negative conductivity of the epitaxial layer is converted to a positive conductivity.

3. A method of forming a buried and isolated layer in an integrated circuit including the steps of,
   (a) forming a substrate of a semiconductive material having a positive conductivity characteristic,
   (b) applying to the substrate a first layer of a semiconductive oxide layer containing a first additive having negative conductivity characteristics and a first rate of diffusion with respect to the material of the substrate,
   (c) forming a pattern of openings in the first layer;
   (d) applying a second layer of a semiconductive oxide containing a second additive having positive conductivity characteristics and a rate of diffusion with respect to the material of the substrate which is faster than the rate of diffusion of the first additive material, said second additive material also being such that the oxide of the first layer acts as a diffusion barrier thereto;
   (e) simultaneously causing the first and second additives to diffuse into the substrate;
   (f) arresting the diffusion operation when the slower diffusing additive materials have penetrated to the required extent in the substrate;
   (g) removing said layers from the substrate;
   (h) operating upon the now exposed surface of the substrate to render it suitable for epitaxial growth;
   (i) epitaxially growing an extension layer to the substrate, said extension layer having a negative conductivity, so as to bury the regions containing the diffused in additives, and;
   (j) subjecting the substrate to a second diffusion operation for a period long enough for the faster diffusing additive to reach the other outer surface of the epitaxial layer, and so that the epitaxial layer material is converted from negative conductivity to a positive conductivity.

* * * * *